United States Patent
Prager et al.

(10) Patent No.: US 7,065,423 B2
(45) Date of Patent: Jun. 20, 2006

(54) OPTICAL METROLOGY MODEL OPTIMIZATION FOR PROCESS CONTROL

(75) Inventors: Dan Prager, Hopewell Junction, NY (US); Jason Ferns, Sunnyvale, CA (US); Lawrence Lane, San Jose, CA (US); Dan Engelhard, Mountain View, CA (US)

(73) Assignee: Timbre Technologies, Inc., Santa Clara, CA (US)

( * ) Notice: Subject to any disclaimer, the term of this patent is extended or adjusted under 35 U.S.C. 154(b) by 26 days.

(21) Appl. No.: 10/888,726

(22) Filed: Jul. 8, 2004

(65) Prior Publication Data

US 2006/0009872 A1 Jan. 12, 2006

(51) Int. Cl.
*G06F 19/00* (2006.01)

(52) U.S. Cl. ........................................ 700/108; 438/16
(58) Field of Classification Search ................... 700/95, 700/96, 108, 110, 121; 438/16
See application file for complete search history.

(56) References Cited

U.S. PATENT DOCUMENTS

| | | | | |
|---|---|---|---|---|
| 6,161,054 A * | 12/2000 | Rosenthal et al. | .......... | 700/121 |
| 6,298,470 B1 * | 10/2001 | Breiner et al. | .................. | 716/4 |
| 6,388,253 B1 * | 5/2002 | Su | .............................. | 250/310 |
| 6,636,843 B1 * | 10/2003 | Doddi et al. | ................... | 706/46 |
| 6,641,746 B1 * | 11/2003 | Houge et al. | .................. | 216/59 |
| 6,645,824 B1 * | 11/2003 | Yang et al. | .................. | 438/401 |
| 6,721,691 B1 * | 4/2004 | Bao et al. | ..................... | 702/189 |
| 6,792,328 B1 * | 9/2004 | Laughery et al. | ........... | 700/121 |
| 2002/0165636 A1 * | 11/2002 | Hasan | ......................... | 700/121 |

* cited by examiner

*Primary Examiner*—Leo Picard
*Assistant Examiner*—Chap Rapp
(74) *Attorney, Agent, or Firm*—Morrison&Foerster LLP

(57) ABSTRACT

To evaluate the adequacy of a profile model, one or more types of process control to be used in controlling a fabrication process are selected. Profile model parameters and acceptable ranges for the profile model parameters are selected. A first and second metrology tools are selected. Statistical metric criteria that define an acceptable amount of variation in measurements obtained using the first and second tools are set. A profile model is selected. A measurement of the profile model parameters is obtained using the first tool and the selected profile model. A measurement of the one or more profile model parameters is obtained using the second tool. Statistical metric criteria are calculated based on the measurements of the one or more profile model parameters obtained using the first and second tools. The calculated and set statistical metric criteria are compared to evaluate the adequacy of the selected profile model.

35 Claims, 6 Drawing Sheets

OPTICAL METROLOGY MODEL OPTIMIZATION FOR PROCESS CONTROL

BACKGROUND

1. Field of the Invention

The present application relates to optical metrology, and more particularly to optical metrology model optimization.

2. Related Art

Optical metrology involves directing an incident beam at a structure, measuring the resulting diffracted beam, and analyzing the diffracted beam to determine various characteristics, such as the profile of the structure. In semiconductor manufacturing, optical metrology is typically used for quality assurance. For example, after fabricating a periodic grating in proximity to a semiconductor chip on a semiconductor wafer, an optical metrology system is used to determine the profile of the periodic grating. By determining the profile of the periodic grating, the quality of the fabrication process utilized to form the periodic grating, and by extension the semiconductor chip proximate the periodic grating, can be evaluated.

Determination of the profile model parameters is typically done by selecting the profile model that meets or exceeds matching criteria of profile model optimization using measures such as goodness of fit, cost, and such. Typically, the specific type or types of process control desired for an application is not considered until the end results of the fabrication steps are evaluated. Types of process control typically include wafer-to-wafer control, lot-to-lot control, and/or within-wafer control. Within-wafer control may be die-to-die or site-to-site control within a wafer.

SUMMARY

In one exemplary embodiment, to evaluate the adequacy of a profile model of a wafer structure to be used for process control of a fabrication process to fabricate the wafer structure, one or more types of process control to be used in controlling the fabrication process are selected. One or more profile model parameters to be measured in implementing the one or more selected types of process control are selected. An acceptable range for each of the selected one or more profile model parameters is selected. A first metrology tool to be used in measuring the one or more selected profile model parameters of the wafer structure is selected. A second metrology tool to be used to calibrate the first metrology tool is selected. One or more statistical metric criteria that define an acceptable amount of variation in measurements obtained using the first metrology tool and the second metrology tool are set. A profile model to be used with the first metrology tool is selected. A measurement of the one or more profile model parameters is obtained using the first metrology tool and the selected profile model. A measurement of the one, or more profile model parameters is obtained using the second metrology tool. The one or more statistical metric criteria are calculated based on the measurements of the one or more profile model parameters obtained using the first and second metrology tools. The one or more calculated statistical metric criteria are compared to the set statistical metric criteria to evaluate the adequacy of the selected profile model.

DESCRIPTION OF DRAWING FIGURES

The present application can be best understood by reference to the following description taken in conjunction with the accompanying drawing figures, in which like parts may be referred to by like numerals:

DETAILED DESCRIPTION

The following description sets forth numerous specific configurations, parameters, and the like. It should be recognized, however, that such description is not intended as a limitation on the scope of the present invention, but is instead provided as a description of exemplary embodiments.

1. Optical Metrology

Figure 1:
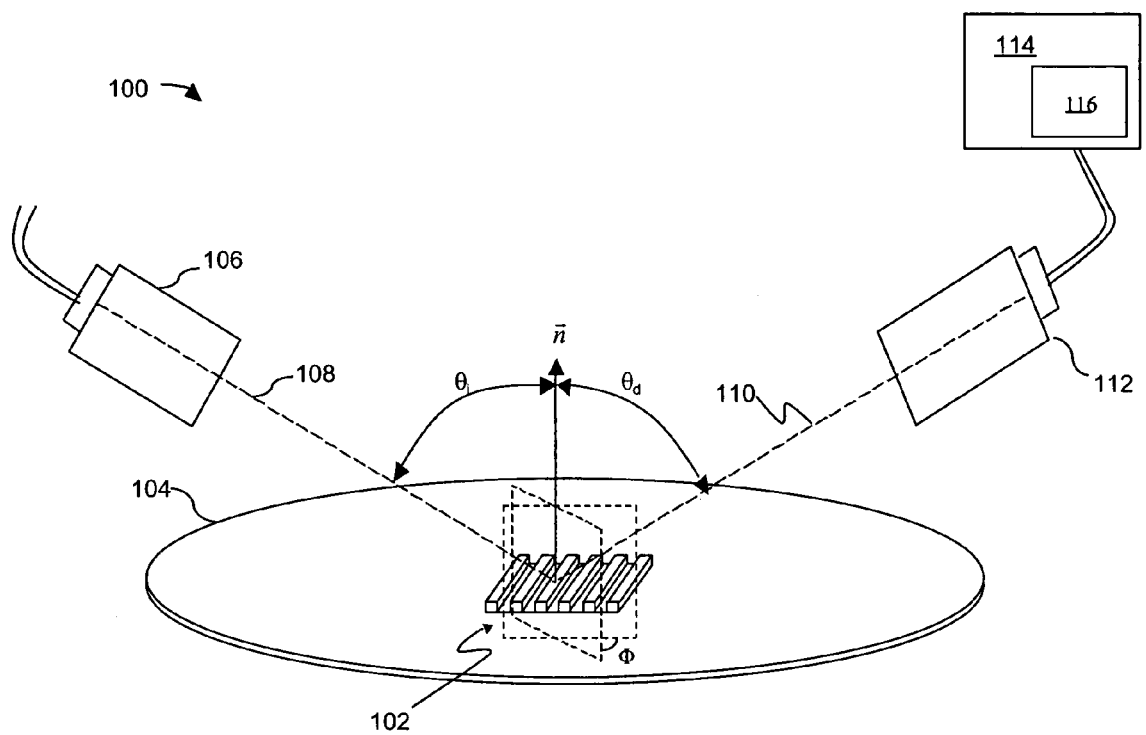
FIG. 1 depicts an exemplary optical metrology system.

With reference to FIG. 1, an optical metrology system 100 can be used to examine and analyze a structure. For example, optical metrology system 100 can be used to determine the profile of a periodic grating 102 formed on wafer 104. As described earlier, periodic grating 102 can be formed in test areas on wafer 104, such as adjacent to a device formed on wafer 104. Alternatively, periodic grating 102 can be formed in an area of the device that does not interfere with the operation of the device or along scribe lines on wafer 104.

As depicted in FIG. 1, optical metrology system 100 can include a photometric device with a source 106 and a detector 112. Periodic grating 102 is illuminated by an incident beam 108 from source 106. In the present exemplary embodiment, incident beam 108 is directed onto periodic grating 102 at an angle of incidence $\theta_i$ with respect to normal $\vec{n}$ of periodic grating 102 and an azimuth angle $\Phi$ (i.e., the angle between the plane of incidence beam 108 and the direction of the periodicity of periodic grating 102). Diffracted beam 110 leaves at an angle of $\theta_d$ with respect to normal $\vec{n}$ and is received by detector 112. Detector 112 converts the diffracted beam 110 into a measured diffraction signal.

To determine the profile of periodic grating 102, optical metrology system 100 includes a processing module 114 configured to receive the measured diffraction signal and analyze the measured diffraction signal. As described below, the profile of periodic grating 102 can then be determined using a library-based process or a regression-based process. Additionally, other linear or non-linear profile extraction techniques are contemplated.

2. Library-Based Process of Determining Profile of Structure

In a library-based process of determining the profile of a structure, the measured diffraction signal is compared to a library of simulated diffraction signals. More specifically, each simulated diffraction signal in the library is associated with a hypothetical profile of the structure. When a match is made between the measured diffraction signal and one of the simulated diffraction signals in the library or when the difference of the measured diffraction signal and one of the simulated diffraction signals is within a preset or matching criterion, the hypothetical profile associated with the matching simulated diffraction signal is presumed to represent the actual profile of the structure. The matching simulated diffraction signal and/or hypothetical profile can then be utilized to determine whether the structure has been fabricated according to specifications.

Thus, with reference again to FIG. 1, in one exemplary embodiment, after obtaining a measured diffraction signal, processing module 114 then compares the measured diffraction signal to simulated diffraction signals stored in a library 116. Each simulated diffraction signal in library 116 can be associated with a hypothetical profile. Thus, when a match is made between the measured diffraction signal and one of the simulated diffraction signals in library 116, the hypothetical profile associated with the matching simulated diffraction signal can be presumed to represent the actual profile of periodic grating 102.

The set of hypothetical profiles stored in library 116 can be generated by characterizing a hypothetical profile using a set of parameters, then varying the set of parameters to generate hypothetical profiles of varying shapes and dimensions. The process of characterizing a profile using a set of parameters can be referred to as parameterizing.

Figure 2A:
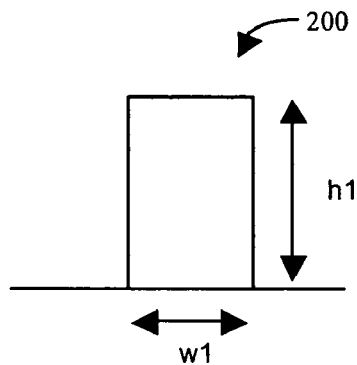
FIGS. 2A–2E depict various hypothetical profiles of a structure.
Figure 2B:
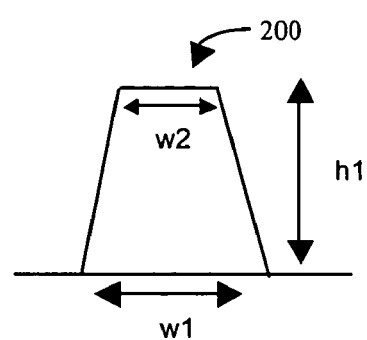
Figure 2C:
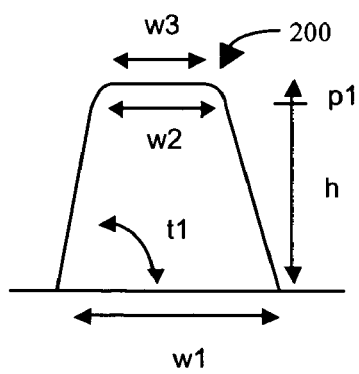
Figure 2D:
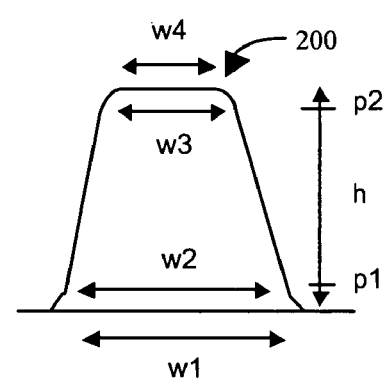
Figure 2E:
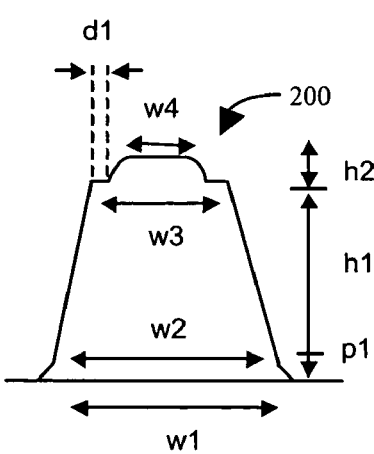

For example, as depicted in FIG. 2A, assume that hypothetical profile 200 can be characterized by parameters h1 and w1 that define its height and width, respectively. As depicted in FIGS. 2B to 2E, additional shapes and features of hypothetical profile 200 can be characterized by increasing the number of parameters. For example, as depicted in FIG. 2B, hypothetical profile 200 can be characterized by parameters h1, w1, and w2 that define its height, bottom width, and top width, respectively. Note that the width of hypothetical profile 200 can be referred to as the critical dimension (CD). For example, in FIG. 2B, parameter w1 and w2 can be described as defining the bottom CD and top CD, respectively, of hypothetical profile 200.

As described above, the set of hypothetical profiles stored in library 116 (FIG. 1) can be generated by varying the parameters that characterize the hypothetical profile. For example, with reference to FIG. 2B, by varying parameters h1, w1, and w2, hypothetical profiles of varying shapes and dimensions can be generated. Note that one, two, or all three parameters can be varied relative to one another.

With reference again to FIG. 1, the number of hypothetical profiles and corresponding simulated diffraction signals in the set of hypothetical profiles and simulated diffraction signals stored in library 116 (i.e., the resolution and/or range of library 116) depends, in part, on the range over which the set of parameters and the increment at which the set of parameters are varied. In one exemplary embodiment, the hypothetical profiles and the simulated diffraction signals stored in library 116 are generated prior to obtaining a measured diffraction signal from an actual structure. Thus, the range and increment (i.e., the range and resolution) used in generating library 116 can be selected based on familiarity with the fabrication process for a structure and what the range of variance is likely to be. The range and/or resolution of library 116 can also be selected based on empirical measures, such as measurements using AFM, X-SEM, and the like.

For a more detailed description of a library-based process, see U.S. patent application Ser. No. 09/907,488, titled GENERATION OF A LIBRARY OF PERIODIC GRATING DIFFRACTION SIGNALS, filed on Jul. 16, 2001, which is incorporated herein by reference in its entirety.

3. Regression-Based Process of Determining Profile of Structure

In a regression-based process of determining the profile of a structure, the measured diffraction signal is compared to a simulated diffraction signal (i.e., a trial diffraction signal). The simulated diffraction signal is generated prior to the comparison using a set of parameters (i.e., trial parameters) for a hypothetical profile (i.e., a hypothetical profile). If the measured diffraction signal and the simulated diffraction signal do not match or when the difference of the measured diffraction signal and one of the simulated diffraction signals is not within a preset or matching criterion, another simulated diffraction signal is generated using another set of parameters for another hypothetical profile, then the measured diffraction signal and the newly generated simulated diffraction signal are compared. When the measured diffraction signal and the simulated diffraction signal match or when the difference of the measured diffraction signal and one of the simulated diffraction signals is within a preset or matching criterion, the hypothetical profile associated with the matching simulated diffraction signal is presumed to represent the actual profile of the structure. The matching simulated diffraction signal and/or hypothetical profile can then be utilized to determine whether the structure has been fabricated according to specifications.

Thus, with reference again to FIG. 1, in one exemplary embodiment, processing module 114 can generate a simulated diffraction signal for a hypothetical profile, and then compare the measured diffraction signal to the simulated diffraction signal. As described above, if the measured diffraction signal and the simulated diffraction signal do not match or when the difference of the measured diffraction signal and one of the simulated diffraction signals is not within a preset or matching criterion, then processing module 114 can iteratively generate another simulated diffraction signal for another hypothetical profile. In one exemplary embodiment, the subsequently generated simulated diffraction signal can be generated using an optimization algorithm, such as global optimization techniques, which includes simulated annealing, and local optimization techniques, which includes steepest descent algorithm.

In one exemplary embodiment, the simulated diffraction signals and hypothetical profiles can be stored in a library 116 (i.e., a dynamic library). The simulated diffraction signals and hypothetical profiles stored in library 116 can then be subsequently used in matching the measured diffraction signal.

For a more detailed description of a regression-based process, see U.S. patent application Ser. No. 09/923,578, titled METHOD AND SYSTEM OF DYNAMIC LEARNING THROUGH A REGRESSION-BASED LIBRARY GENERATION PROCESS, filed on Aug. 6, 2001, which is incorporated herein by reference in its entirety.

4. Rigorous Coupled Wave Analysis

As described above, simulated diffraction signals are generated to be compared to measured diffraction signals. As will be described below, in one exemplary embodiment, simulated diffraction signals can be generated by applying Maxwell's equations and using a numerical analysis technique to solve Maxwell's equations. More particularly, in the exemplary embodiment described below, rigorous coupled-wave analysis (RCWA) is used. It should be noted, however, that various numerical analysis techniques, including variations of RCWA, can be used.

In general, RCWA involves dividing a profile into a number of sections, slices, or slabs (hereafter simply referred to as sections). For each section of the profile, a system of coupled differential equations generated using a Fourier expansion of Maxwell's equations (i.e., the components of the electromagnetic field and permittivity (ε)). The system of differential equations is then solved using a diagonalization procedure that involves eigenvalue and eigenvector decomposition (i.e., Eigen-decomposition) of the characteristic matrix of the related differential equation system. Finally, the solutions for each section of the profile are coupled using a recursive-coupling schema, such as a scattering matrix approach. For a description of a scattering matrix approach, see Lifeng Li, "Formulation and comparison of two recursive matrix algorithms for modeling layered diffraction gratings," J. Opt. Soc. Am. A13, pp 1024–1035 (1996), which is incorporated herein by reference in its entirety. For a more detail description of RCWA, see U.S. patent application Ser. No. 09/770,997, titled CACHING OF INTRA-LAYER CALCULATIONS FOR RAPID RIGOROUS COUPLED-WAVE ANALYSES, filed on Jan. 25, 2001, which is incorporated herein by reference in its entirety.

5. Machine Learning Systems

In one exemplary embodiment, simulated diffraction signals can be generated using a machine learning system (MLS) employing a machine learning algorithm, such as back-propagation, radial basis function, support vector, kernel regression, and the like. For a more detailed description of machine learning systems and algorithms, see "Neural Networks" by Simon Haykin, Prentice Hall, 1999, which is incorporated herein by reference in its entirety. See also U.S. patent application Ser. No. 10/608,300, titled OPTICAL METROLOGY OF STRUCTURES FORMED ON SEMICONDUCTOR WAFERS USING MACHINE LEARNING SYSTEMS, filed on Jun. 27, 2003, which is incorporated herein by reference in its entirety.

6. Evaluating Adequacy of a Profile Model

Figure 3:
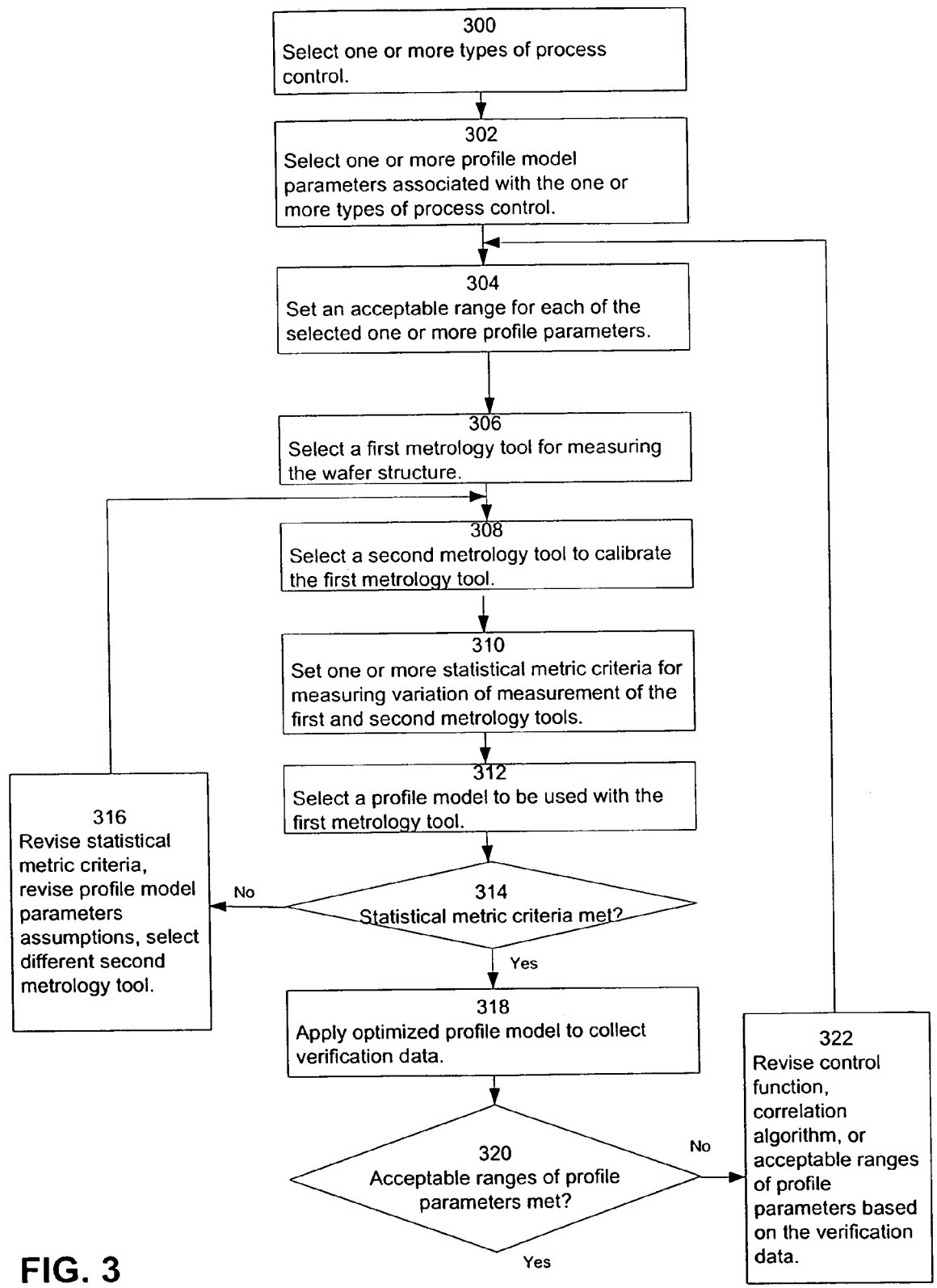
FIG. 3 is an exemplary process for optimizing a profile model for process control.

With reference to FIG. 3, an exemplary process of evaluating the adequacy of a profile model of a wafer structure to be used for process control of a fabrication process to fabricate the wafer structure is depicted. The profile model characterizes the profile of the wafer structure using profile model parameters.

In step 300, one or more types of process control are selected. As mentioned above, types of process control typically include wafer-to-wafer control, lot-to-lot control, within-wafer control, and the like. Within-wafer control can include die-to-die or site-to-site control within a wafer.

In step 302, one or more profile model parameters to be measured in implementing the one or more types of process control are selected. For example, if wafer-to-wafer is selected as the type of process control, one or more critical dimensions (CD) of the structure, such as a middle CD of the structure, can be selected as the one or more profile model parameters to be measured in implementing the wafer-to-wafer process control. As another example, if within-wafer is selected as the type of process control, the top CD of the structure can be selected as the profile model parameter to be measured in implementing the within-wafer process control. As still another example, if a combination of wafer-to-wafer and within-wafer are selected as the types of process control, the bottom CD and sidewall angle can be selected as the profile model parameters to be measured in implementing the wafer-to-wafer and within-wafer process controls.

In step 304, an acceptable range for each of the selected one or more profile parameters is set. For example, in the example above of selecting wafer-to-wafer as the type of process control, a middle CD of between 30 to 36 nanometers (nm) can be set as the acceptable range of middle CD. In the example above of selecting within-wafer as the type of process control, a top CD of between 24 to 28 nm as an average for selected measurement sites within the wafer can be set as the acceptable range of top CD. In the example above of selecting wafer- to wafer and within-wafer as the types of process control, a bottom CD of between 30 to 36 nm and a sidewall angle of between 80–85 degrees can be set as the acceptable range acceptable ranges of bottom CD and sidewall angle for the wafer-to-wafer process control, and an average sidewall angle from 80 to 87 degrees among selected sites in the wafer can be set as the acceptable range of sidewall angle for the within-wafer process control. As mentioned above, one or more profile model parameters are selected for each type of process control selected, and an acceptable range is set for each profile model parameter selected.

In step 306, a first metrology tool is selected to be used in measuring the one or more selected profile model parameter of the wafer structure during the fabrication process. The first metrology tool can be a cross section scanning electron microscope (XSEM), CD atomic force microscope (CD-AFM), transmission electron microscope (TEM), CD scanning electron microscope (CDSEM), scatterometer, and the like. A scatterometer can include an ellipsometer, a reflectometer, and the like. Note that in this specification, the term "new metrology tool" is used interchangeably to refer to the first metrology tool.

In step 308, a second metrology tool is selected to calibrate the first metrology tool. The second metrology tool can be a cross section scanning electron microscope (XSEM), CD atomic force microscope (CD-AFM), transmission electron microscope (TEM), CD scanning electron microscope (CDSEM), scatterometer, and the like. For example, a TEM can be used to calibrate a CDSEM and in turn, the CDSEM can be used to calibrate a scatterometer.

In one exemplary embodiment, the second metrology tool is a scatterometer and the first metrology tool is a CDSEM. In another exemplary embodiment, the second metrology tool is one type of scatterometer, and the first metrology tool is another type of scatterometer. For example, the second metrology tool is a reflectometer, and the first metrology tool is an ellipsometer. In yet another exemplary embodiment, the second and first metrology tools are the same types of scatterometers, but the first scatterometer is an integrated scatterometer, and the second scatterometer is a previously calibrated standalone scatterometer. Note that in this specification, the term "reference metrology tool" is used interchangeably to refer to the second metrology tool.

In step 310, one or more statistical metric criteria that define an acceptable amount of variation in measurements obtained using the first and second metrology tools are set. The statistical metric criteria can include one or more of the standard least-squares method with Gaussian statistics and experimental uncertainties, Gaussian statistics and analytic uncertainties, Poisson statistics and analytic uncertainties, Steyx, and the like. For the first three statistical metric criteria, refer to Bevington, et al., "Data Reduction and Error Analysis For the Physical Sciences", Third Edition, pages 98–114, which is incorporated herein in its entirety. Another suitable statistical metric criterion is the total measurement uncertainty, also known as the Mandel method. For a discussion of the Mandel method, refer to J. Mandel, "Fitting Straight Lines when Both Variables are Subject to Error", Journal of Quality Technology, Vl. 16, No. 1, p. 1–14, January 1984, which is incorporated herein in its entirety. It is understood that other statistical metric criteria other than those mentioned above may be used as long as the concepts of propagation of errors from tool to tool and probabilities and distribution of each tool measurements are taken into account.

To illustrate an example of a statistical metric criterion that can define an acceptable amount of variation in measurements obtained between the first and second metrology tools, assume a standard least square method is selected. A value of a slope β and intercept α can be set utilizing the following basic linear equation:

$$y = \beta x + a \quad (1.00)$$

where y is the measurement of the first metrology tool, and x is the measurement of the second metrology tool.

An uncertainty or net residual error $\sigma^2$ for α and β can be obtained from the following equations:

$$\sigma_\alpha^2 = \frac{\sigma^2}{\Delta'} \sum (x_i)^2 \quad (1.10)$$

$$\sigma_\beta^2 = N \frac{\sigma^2}{\Delta'} \text{ where} \quad (1.20)$$

$$\sigma^2 = \frac{1}{N-2} \sum (y_i - \alpha - \beta x_i)^2 \text{ and}$$

$$\Delta' = N \sum x_i^2 - (x_i)^2.$$

A coefficient of determination, $R^2$ is equal to:

$$R^2 = 1 - \frac{SSE}{S_{yy}} \text{ where} \quad (1.30)$$

$$S_{YY} = \sum_{i=1}^{N} (y_i - \bar{y})^2 \text{ and}$$

$$SSE = \sum_{i}^{N} (y_i - \alpha - \beta x_i)^2.$$

The net residual error σ and/or the amount of variability inherent in the regression model $\sigma^2$ can also be specified as formulated in the following equation:

$$\sigma^2 = \frac{1}{N-2} \sum (y_i - \bar{y}_i)^2 \quad (2.00)$$

where N is the number of degrees of freedom.

If Poisson statistics and analytic uncertainties are selected, values of slope β and intercept α can be obtained by simultaneously solving the following equations:

$$N = \sum \frac{y_i}{\alpha + \beta x_i} \quad (3.10)$$

$$\sum x_i = \sum \frac{x_i y_i}{\alpha + \beta x_i}. \quad (3.20)$$

Although a linear relationship of the variables is used in the examples illustrated, it is understood that non-linear functional relationships between the variables can be used, such as polynomial, arbitrary functions, composite functions, and the like. Least squares fit solutions to a polynomial may include the determinant, matrix, independent parameter solutions, and the like. Least squares fit to an arbitrary function may include nonlinear fitting method, searching parameter space method, grid search method, gradient search method, expansion method, the Marquardt method, and the like. For a detailed discussion of these techniques, refer to Bevington, et al., "Data Reduction and Error Analysis for the Physical Sciences", Third Edition, pages 116–177, which is incorporated herein in its entirety.

If total measurement uncertainty is used, equations for the offset average, β, and TMU described in the Mandel method, referred to as Mandel metrics, can be used to calculate the statistical metric criteria as shown below:

$$\beta = \frac{S_{yy} - \lambda S_{XX} + \sqrt{(S_{YY} - \lambda S_{XX})^2 + 4\lambda S_{YX}^2}}{2 S_{YX}} \quad (4.10)$$

$$\hat{\sigma}_{MANDEL} = \sqrt{\frac{\sum_{i=1}^{N} \{(y_i - \hat{y}_i)^2 + (x_i - \hat{x}_i)^2\}}{N-2}} \quad (4.20)$$

$$TMU = 3\sqrt{\hat{\sigma}_{MANDEL}^2 - \hat{\sigma}_{RT}^2} \quad (4.30)$$

$$\text{Offset average} = (\bar{x} - \bar{y}) \quad (4.40)$$

where:

$$S_{YX} = \sum_{i=1}^{N} (y_i - \bar{y}_i)(x_i - \bar{x})$$

$$S_{XX} = \sum_{i=1}^{N} (x_i - \bar{x})^2$$

$\hat{\sigma}_{RT}$ is the measurement uncertainty of the second metrology tool, $\hat{\sigma}_{NT}$ is the measurement uncertainty of the first metrology tool, y represents values of measurement for the second metrology tool, x represents values of measurement for the first metrology tool, $$\lambda = \frac{\sigma_{RT}^2}{\sigma_{NT}^2}$$

is the Mandel parameter calculated as the ratio of the squared measurement uncertainty of the second metrology tool to the squared measurement uncertainty of the first metrology tool, and the caret symbol, for example $\hat{\sigma}_{NT}$, represents an estimate of the variable or quantity underneath it.

In step 310, if the Mandel method is selected as the statistical metric criterion, values of the offset average, β, and the TMU are set. If two or more second or reference metrology tools are selected, the set of β, offset average, and the TMU for each reference metrology tool are set. Equation 4.30 is expanded to net out the residual error of all the reference metrology tools.

If STEYX is selected as the statistical metric criterion, the standard error of the prediction of y for an individual x is given by the following formula:

$$S_{yx} = \sqrt{\frac{1}{n(n-2)} \left[ \frac{[n\sum y^2 - (\sum y)^2] - \frac{[n\sum xy - (\sum x)(\sum y)]^2}{n\sum x^2 - (\sum x)^2}}{} \right]} \quad (5.00)$$

where n is the number of paired values of x and y.

In step 312, the profile model to be used with the first metrology tool is selected. As mentioned above, a profile model can be defined by profile model parameters, such as width of the structure, sidewall angle, height of the structure, thickness of underlying films, and the like. Depending on the complexity of the profile of the structure, one technique is to use basic geometric shapes to characterize the profiles. The dimensions of the one or more geometric shapes correspond to the profile model parameters.

Figure 4:
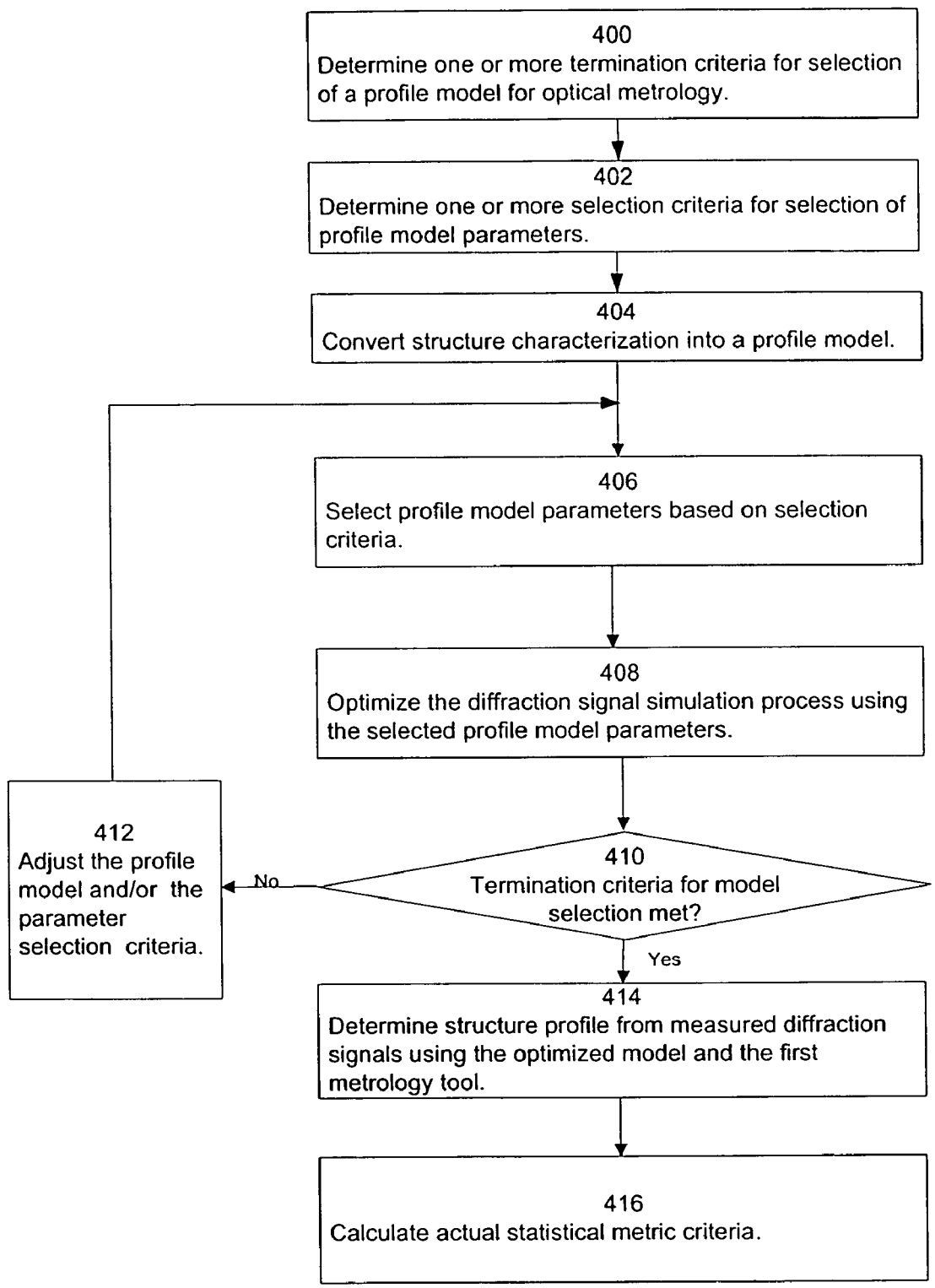
FIG. 4 is an exemplary process for selecting a profile model that meets profile model selection criteria.

With reference to FIG. 4, an exemplary process of selecting a profile model is depicted. In step 400, one or more termination criteria for selection of a profile model are determined. Termination criteria can include goodness of fit (GOF), cost function, sum squared error (SSE), and the like.

In step 402, one or more selection criteria for profile model parameters are selected. Selection criteria for profile model parameters can include a correlation coefficient of a profile parameter to another profile parameter, confidence interval for a profile parameter, sensitivity of the profile parameter to changes in the diffracted signal, and the like.

In step 404, the structure characterization is converted into a profile model. For example, if a single trapezoid is deemed sufficient to model a structure as depicted in FIG. 2B, then the bottom width, top width, and height are used to characterize the structure.

In step 406, profile model parameters are selected based on the one or more selection criteria for profile model parameters. For example, if a correlation coefficient of a parameter to other parameters of less than 0.90 is the selection criterion, then only profile model parameters that are correlated to other parameters by less than 0.90 are selected.

In step 408, using the selected profile model parameters, the diffraction signal simulation process is optimized. One such technique of performing this step is described above in the discussion for regression-based process of determining profile of a structure.

In step 410, the values of the termination criteria are evaluated for diffraction signal simulation results versus the termination criteria determined in step 400. If the termination criteria are met or exceeded, then optimization of the profile model is complete, otherwise, the profile model and/or the parameter selection criteria are adjusted, step 412, and the selection of profile model parameters, step 406, and optimization of the diffraction signal, step 408, are iterated.

For example, a 0.95 GOF for the optimized diffraction signal simulation compared to the measured diffraction signal is selected as a termination criterion. Assume that after performing the optimization step 408, the optimized diffraction signal simulation yielded a 0.90 GOF compared to a measured diffraction signal. Since the termination criterion is not met, the profile model may be adjusted by changing the geometric shapes used to approximate the model, such as changing from a double-trapezoid profile model to a single-trapezoid profile model. In addition, the selection criteria for profile model parameters may also be changed. Subsequently, the selection of profile model parameters and optimization of the diffraction signal simulation process is iterated. If the new optimized diffraction signal simulation yields a 0.96 GOF compared to a measured diffraction signal, then the termination criterion based on a 0.95 GOF is met and this portion of the process is complete and processing proceeds to subsequent steps.

For a more detailed description of profile model and profile model parameter selection, see U.S. patent application Ser. No. 10/206,491 titled MODEL AND PARAMETER SELECTION FOR OPTICAL METROLOGY, filed on Jul. 25, 2002, which is incorporated herein by reference in its entirety.

In step 414, the structure profile is determined from diffraction signals off the structure using the optimized profile model and the first metrology tool. For example, if the first metrology tool is a scatterometer and more specifically a reflectometer, the diffraction signal off the structure is measured by the reflectometer. The profile parameters corresponding to the measured diffraction signal is determined using one of the techniques discussed above such as regression, using a library, or using a machine learning system.

In step 416, the actual statistical metric criteria values are calculated. For example, if a reflectometer is the selected first metrology tool, the second metrology tool is a CDSEM, and Mandel metrics are selected as the statistical metric criteria, then the offset average, $\beta$, and TMU are calculated using the appropriate equations above and values of the profile parameters obtained in step 414.

With reference again to FIG. 3, in step 314, the calculated statistical metric criteria for the first metrology tool are compared to the set statistical metric criteria to see if these are met. As an illustrative example, assume wafer-to-wafer control of the middle CD of the structure is the process control type selected, and an acceptable range of 50 to 70 nm for the structure middle CD after one or more subsequent fabrication process steps is selected. Assume further that the second metrology tool selected is a CDSEM and the first metrology tool for measuring the structure parameters is a scatterometer and that the statistical metric criteria values set are an offset average $\alpha$ equal to or less than 4.0, a slope $\beta$ of at least 0.80, and a $R^2$ of 0.95 or better. The scatterometer, which can be a reflectometer or ellipsometer or the like, is used to measure the diffraction signals off the wafer structure after a fabrication step such as a lithography step. Profile model parameters are determined from measured diffraction signals using regression, a library method or a trained MLS as described above. The CDSEM measurements are compared to the scatterometry measurements in order to calculate the statistical metric criteria comprising $\alpha$, $\beta$, and $R^2$ using the appropriate equations above. The calculated results of the statistical metric criteria are compared to the preset values.

If the calculated statistical metric criteria are within the matching requirements, then selection of the profile model for process control is complete, with the selected profile model being an optimized profile model. Otherwise, in step 316, revisions may be made to the choice of second metrology tool, to the statistical metric criteria, and/or to the profile model selection termination criteria. An example of revision of the second or reference metrology tool is where a CDSEM is replaced with a CD-AFM. If two reference metrology tools such as a CD-AFM and a CDSEM were used, the setup can be revised to use a TEM and a CDSEM. For the statistical metric criteria, if $R^2$ was previously selected, it may be revised to use Mandel metrics, or if Mandel metrics was previously selected, the TMU may be set at a different value. Alternatively, Poisson statistics and analytic uncertainties may be used wherein values of the slope β, intercept α, and $R^2$ are set. As before, the values of the slope β, intercept α, and $R^2$ can be set at different values. The profile model may also be changed; for example, the profile model may be changed from three trapezoids to two trapezoids. Alternatively, a film thickness in the underlying layers of the profile model that was previously allowed to float may be fixed or conversely, a fixed film thickness may be allowed to float. As mentioned above, alternative embodiments may utilize functional relationship of the second metrology tool measurement to the first metrology tool measurement that assumes a polynomial function or an arbitrary function.

To illustrate another example, assume the process control type selected is within-wafer control such site-to-site control or die-to-die control, and the second metrology tool selected is a CD-AFM. Assume the first metrology tool is a scatterometer. Also, assume that statistical metric criteria using the standard least-squares method with Poisson statistics and experimental uncertainties are selected and values for these statistical metric criteria are set. The profile model is optimized based on selected profile model parameters and on one or more termination criteria. The resulting optimized profile model may be used to create a library or used to create a training database for an MLS-based metrology system. The library or the trained MLS-based metrology system is used to determine the profile model parameters of the structure using the diffraction measurements from the scatterometer. Since the process control type is within-wafer, then measurement of the structure with the scatterometer and with the CD-AFM will include selected sites or selected dies within the wafer. The standard least squares statistical metric criteria incorporating Poisson statistics and experimental uncertainties are calculated using the CD-AFM and scatterometric measurements of the structure. The calculated statistical metric criteria are compared to the set values.

In other embodiments, the process control type may be lot-to-lot control. A similar set of process steps are required to optimize the optical metrology model that meets the set statistical metric criteria. It is understood that there are other combinations of the selected control types, profile model parameters, first and second metrology tools, statistical metric criteria, and profile model selection criteria that will work best for certain applications.

Figure 5:
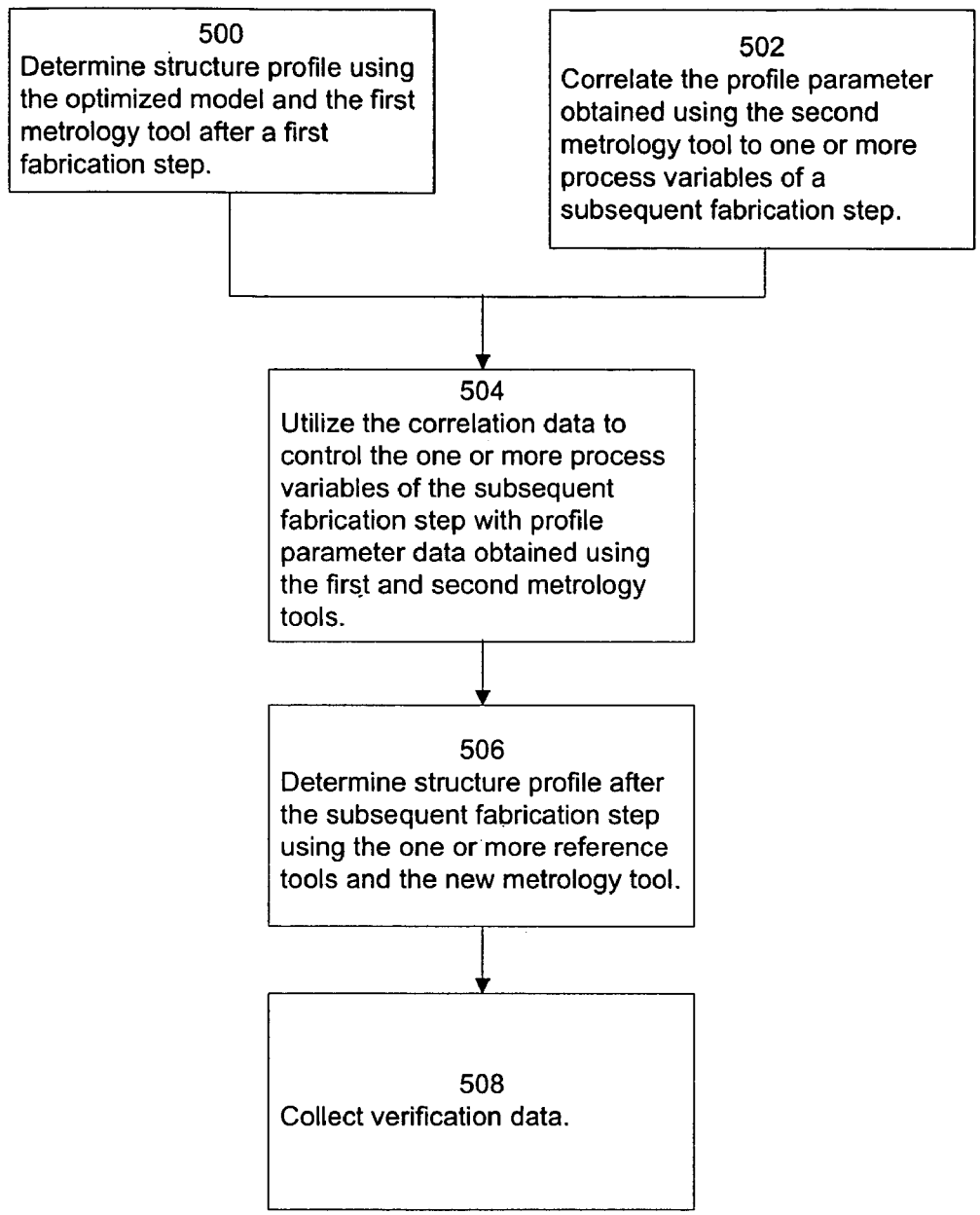
FIG. 5 is an exemplary process for applying the selected profile model to collect verification data.

After the optimized profile model has been selected, in step 318, the optimized profile model is applied to collect verification data. With reference to FIG. 5, an exemplary process for applying the optimized profile model to collect verification data is depicted. FIG. 5 utilizes terms such as first fabrication step and subsequent fabrication step. The first and subsequent fabrication steps can be different or same types of fabrication processes. For example, the first fabrication step can be a lithography step, where the structure may be formed from a resist. The subsequent fabrication step can be a resist trimming step. Alternatively, the first fabrication step can be a first etch step, and the subsequent step can be another etch step.

In step 500, after the first fabrication step, the structure profile and CD are determined using the optimized profile model to determine the profile and CD from structure measurements with the first metrology tool. In step 502, one or more profile model parameters of the structure obtained from the second metrology tool measurement is correlated to one or more process variable of a subsequent fabrication step. Correlation may be based on empirical data collected based on the recipe or based on an algorithm determined from simulation of the process using semiconductor process simulation software such as Raphael™, Prolith™ or the like. For example, the top CD of the structure measured using a CDSEM as a reference metrology tool may be correlated to one or more of the process variables in a later fabrication step, the variables including temperature, gas flow rate, pressure, time, or the like. More specifically, the top CD of a resist may be correlated to the gas flow rate of a subsequent etch step, wherein the etch step includes a structure trimming operation and the resulting trim is a function of the gas flow rate.

In step 504, the correlation data is utilized to control the one or more process variables of the subsequent fabrication step with profile parameter data obtained using the first metrology tool and the second metrology tool. In step 506, after the subsequent fabrication step is completed, the structure profile is determined using the second metrology tool and the first metrology tool. For example, after an etch fabrication step, the profile of the structure is measured with both a CDSEM as the second or reference metrology tool and a scatterometer as the first metrology tool. The measurements are designed to capture the data needed for the process control type selected. As mentioned above, if the process control type selected is wafer-to-wafer control, then the measurements should ensure that a sufficient number of wafers are measured at selected sites. If within-wafer control is selected, then the selected sites in a wafer are measured to provide a picture of the statistical deviation of the selected one or more profile parameters among the sites and statistical deviation of the first metrology tool measurements compared to the second or reference metrology tool measurements. In step 508, the relevant verification data are collected, such as statistical deviation of the first metrology tool measurement compared to the reference metrology tool measurement as well as statistical data related to the selected process control type.

With reference again to FIG. 3, in step 320, the measured/actual ranges of the selected profile parameters are compared to the acceptable ranges of parameters set for the process control type. As an example, assume wafer-to-wafer process control type was selected and a range of 50 to 80 nm for the middle CD after the subsequent fabrication process steps was set as the acceptance criteria. The actual measurements of middle CD are determined and compared to the range of 50 to 80 nm. Alternatively, the acceptable range may be expressed in statistical measures such as mean, average deviation, variance, standard deviation, multiples of the standard deviation, and the like. More specifically, if a 3σ of 4 nm or less is set as the acceptable range for the structure after an etch fabrication step, the 3σ of the actual measurements of the middle CD is compared to 4 nm. If the actual 3σ is not greater than 4 nm, the acceptable range criterion for this process control type is met and the process is complete.

The acceptable range criteria for the one or more selected process control type may not be met due to a variety of reasons. Some of the causes include inaccuracies in the correlation function between the selected profile parameter to the process variable in a subsequent fabrication step. The correlation function may change due to device drift over time or due to changes to operating conditions, changes to the recipe or changes to components of critical metric devices, or changes to the fabrication device such as the track or etch equipment. Alternatively, the optimized profile model, in combination with device or process changes previously mentioned, may no longer provide the accuracy or precision required of the structure CD desired in the end product.

In step 322, verification data previously collected in step 318 may be used as the basis to revise the correlation algorithm of structure parameter to process variable in the subsequent process step, revise acceptable ranges of the selected one or more profile model parameters, and/or revise the assumptions of the optical metrology model. Examples of changes to the assumptions of the optical metrology model include changes of variables allowed to float into constant values and vice versa. Steps 304, 306, 308, 310, 312, 314, 318, and 320 are iterated until the acceptable range criteria are met.

Figure 6:
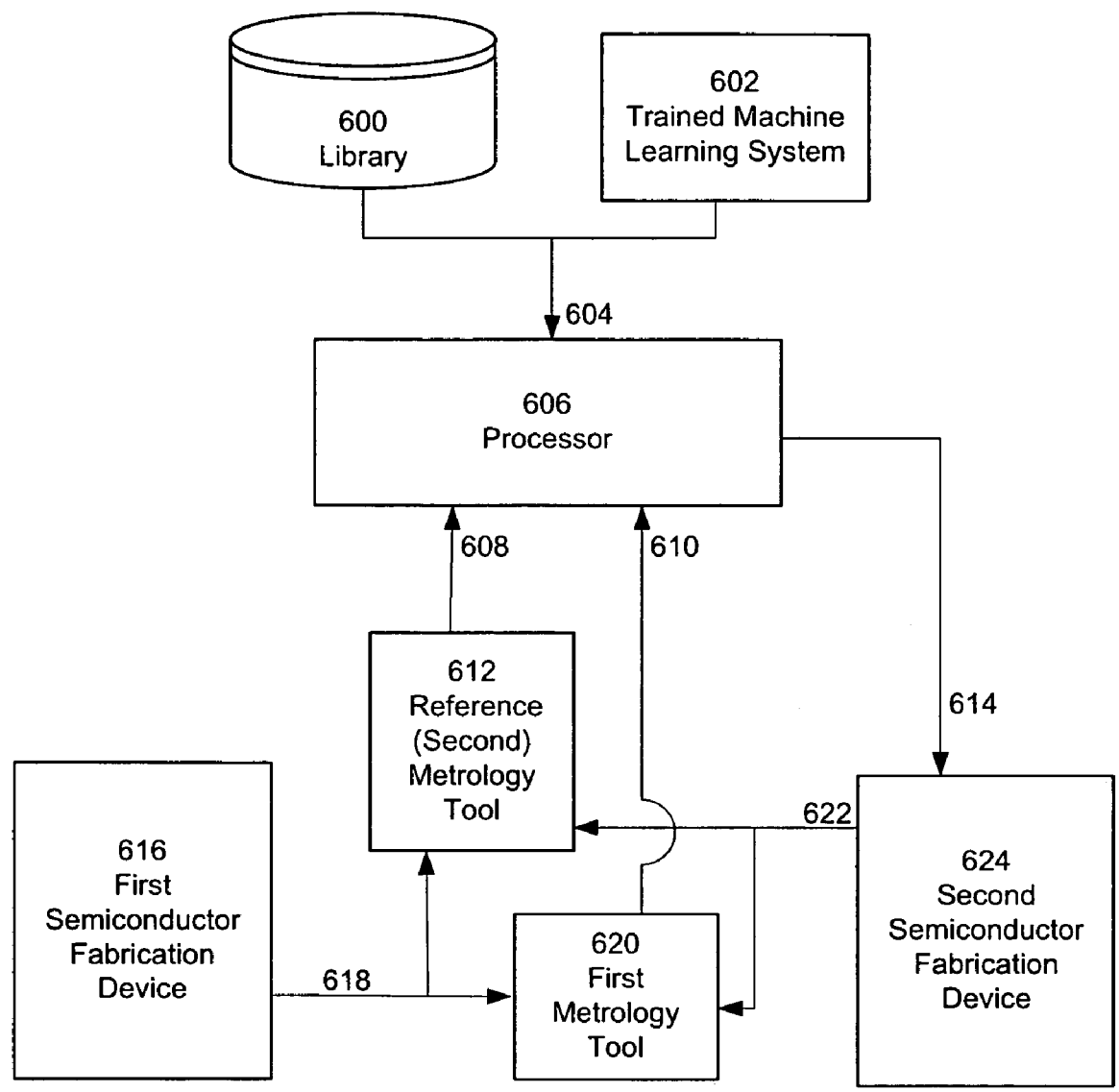
FIG. 6 is an exemplary architectural chart of a system to optimize a metrology model for process control.

FIG. 6 is an exemplary architectural chart of a system configured to optimize a metrology model for process control. A first semiconductor fabrication device 616 is coupled to a reference or second metrology tool 612 and a wafer 618 with the structure to be measured is made available to the reference metrology tool 612. The first semiconductor fabrication device 616 may be a lithography device and the reference metrology tool 612 may be a CDSEM. The first semiconductor fabrication device 616 is also coupled to the first metrology tool 620. The wafer 618 with the structure to be measured is made available to the first metrology tool 620. The first metrology tool 620 may be scatterometer such as a reflectometer or an ellipsometer. The reference metrology tool 612 and the first metrology tool 620 are both coupled to a processor 606. A second semiconductor fabrication device 624 is coupled to the reference metrology tool 612 and the first metrology tool 620. The second semiconductor fabrication device 624 may be a track or an etch device. The wafer 622 with the structure to be measured after one or more process steps in the second semiconductor fabrication device 624 is made available to the reference metrology tool 612 and to the first metrology tool 620.

Still referring to FIG. 6, coupled to the processor 606 are a metrology library 600 and a trained machine learning system (MLS) 602. The library 600 includes a set of diffraction signals and corresponding structure profile model parameters of the structure. The library 600 may include a sub-library for profile extraction of the wafer structure after a process step in the first semiconductor fabrication device 616 and another sub-library for profile extraction of the wafer structure after a process step in the second semiconductor fabrication device 624. Similarly, the trained MLS 602 may include a subsystem trained to determine the structure profile model parameters of the wafer structure from measured diffraction signals after the process step in the first semiconductor fabrication device 616 and a subsystem trained to determine the wafer structure profile model parameters of the wafer structure from measured diffraction signals after the process step in the second semiconductor fabrication device 624. The processor 606 uses the appropriate sub-library 600 or trained MLS subsystem 602 to extract profile model parameters 604 corresponding to the output signals 608 or 610 received from the metrology tools 612 and 620 respectively. The processor 606 is configured to perform the computation and data processing steps depicted in the FIGS. 3, 4, and 5.

In one embodiment, the reference metrology tool 612 may be integrated with the first semiconductor fabrication device 616 or integrated with the second semiconductor fabrication device 624 or maybe a standalone unit. The first metrology tool 620 may be integrated with the first semiconductor fabrication device 616 or may be integrated with the second semiconductor fabrication device 624 or maybe a standalone unit. In another embodiment, the first semiconductor fabrication device 616 and the second semiconductor fabrication device 624 comprise a single unit, such as an etch device capable of performing at least two etch processes.

Still referring to FIG. 6, as mentioned above, the reference metrology tool 612 and the first metrology tool 620 are coupled to the processor 606. The reference metrology tool 612 transmits an output signal 608 representing the measurement for the wafer structure to the processor 606. The first metrology tool 620 transmits an output signal 610 representing the diffraction signal measurement for the wafer structure to the processor 606. The processor 606 creates a correlation between one or more selected profile parameters determined by the reference metrology tool 612 to a process variable of the second semiconductor fabrication device 624, the correlation typically expressed as a correlation curve, table, database, or the like. As mentioned above, the process variable may include temperature, pressure, length of processing, etchant flow rate or gas flow rate, and the like. Based on the value of the selected profile parameters, the processor 606 sends an output signal 614 to the second semiconductor fabrication device 624 to adjust the process variable included in the correlation function.

Although exemplary embodiments have been described, various modifications can be made without departing from the spirit and/or scope of the present invention. For example, another embodiment wherein the first semiconductor fabrication device is a device that completes a step before develop-and-inspect wafer testing. Similarly, the second semiconductor fabrication device may be a device that completes a step before finish-and-inspect wafer testing. In such an embodiment, there would be at least two subsequent fabrication steps between the first and second semiconductor fabrication devices. In another embodiment, the reference metrology tool may be a well-calibrated scatterometer and the first metrology tool is a CDSEM. Therefore, the present invention should not be construed as being limited to the specific forms shown in the drawings and described above.

We claim:

1. A method of evaluating the adequacy of a profile model of a wafer structure to be used for process control of a fabrication process to fabricate the wafer structure, the profile model including profile model parameters, the method comprising:
   a) selecting one or more types of process control to be used in controlling the fabrication process;
   b) selecting one or more profile model parameters to be measured in implementing the one or more selected types of process control;
   c) setting an acceptable range for each of the selected one or more profile model parameters;
   d) selecting a first metrology tool to be used in measuring the one or more selected profile model parameters of the wafer structure during the fabrication process;
   e) selecting a second metrology tool used to calibrate the first metrology tool;
   f) setting one or more statistical metric criteria that define an acceptable amount of variation in measurements obtained using the first metrology tool and the second metrology tool;
   g) selecting a profile model to be used with the first metrology tool;
   h) obtaining a measurement of the one or more profile model parameters using the first metrology tool and the selected profile model;
   i) obtaining a measurement of the one or more profile model parameters using the second metrology tool;

j) calculating the one or more statistical metric criteria based on the measurements of the one or more profile model parameters obtained using the first and second metrology tools;

k) comparing the one or more calculated statistical metric criteria to the one or more set statistical metric criteria to evaluate the adequacy of the selected profile model.

2. The method of claim 1 wherein the one or more types of process control include wafer-to-wafer control, lot-to-lot control, and/or within-wafer control.

3. The method of claim 2 wherein the within-wafer control includes die-to-die control or site-to-site control.

4. The method of claim 1 wherein the acceptable range for each of the selected one or more profile model parameters includes a range of dimensions, average deviation from the mean, variance from the mean, standard deviation from the mean, and/or multiples of the standard deviation from the mean.

5. The method of claim 1 wherein the one or more statistical metric criteria include standard least-squares method with Gaussian statistics and experimental uncertainties, Gaussian statistics and analytic uncertainties, Poisson statistics and analytic uncertainties, Steyx, and/or total measurement uncertainty.

6. The method of claim 1 wherein the second metrology tool includes a cross section scanning electron microscope (XSEM), a critical dimension atomic force microscope (CD-AFM), a transmission electron microscope (TEM), a critical dimension scanning electron microscope (CDSEM), or a scatterometer.

7. The method of claim 1 wherein the first metrology tool includes an XSEM, a CD-AFM, a TEM, a CDSEM, or a scatterometer.

8. The method of claim 1 wherein if the one or more calculated statistical metric criteria and the one or more set statistical metric criteria are not within a matching criterion, further comprising:

l) revising the one or more statistical metric criteria, revising a profile model parameter setting, and/or selecting a different second metrology tool, wherein the profile model parameter setting is revised from a floating variable to a constant or from a constant to a floating variable; and m) iterating steps (e)–(k).

9. The method of claim 1 wherein selecting the profile model comprises:

determining one or more termination criteria for profile model selection;

determining one or more selection criteria for profile model parameters;

converting structure characterization into a profile model;

selecting profile model parameters based on the one or more selection criteria for profile model parameters; and optimizing a diffraction signal simulation process using the selected profile model parameters and the one or more termination criteria.

10. The method of claim 1 wherein if the one or more calculated statistical metric criteria and the one or more set statistical metric criteria are met within a matching criterion, the selected profile model is an optimized profile model, and further comprising:

l) applying the optimized profile model to collect verification data, the verification data including measured ranges of the selected one or more profile model parameters; and m) comparing the measured ranges of the selected one or more profile model parameters to the set acceptable ranges of the selected one or more profile model parameters.

11. The method of claim 10 wherein applying the optimized profile model to collect verification data further comprises:

determining a first profile of the structure using the optimized profile model and the first metrology tool after a first fabrication step;

correlating the one or more profile model parameters obtained using the second metrology tool to one or more process variables of a second fabrication step to create a correlation function, wherein the second fabrication step is subsequent to the first fabrication step;

utilizing the one or more profile model parameters and the correlation function to control one or more process variables of the second fabrication step;

determining a second profile of the structure using the first metrology tool and the second metrology tool after the second fabrication step; and collecting verification data.

12. The method of claim 11 wherein the correlation function is a linear function, a least squares fit to a polynomial function, or a least squares fit to an arbitrary function.

13. The method of claim 12 wherein the least squares fit to a polynomial function is a determinant, matrix, or independent parameter solution function.

14. The method of claim 12 wherein the least squares fit to an arbitrary function is a nonlinear fitting method, searching parameter space method, grid search method, gradient search method, expansion method, or the Marquardt method.

15. The method of claim 11 wherein the one or more profile model parameters include critical dimension, sidewall angle, height, bottom width, top width, and/or middle width of the structure.

16. The method of claim 11 wherein the one or more process variables of the second fabrication step to create the correlation function include temperature, etchant flow rate, gas flow rate, pressure, and/or time.

17. The method of claim 11 wherein collecting verification data comprises:

calculating statistical measures of the one or more profile model parameters determined using the second metrology tool or determined using the first metrology tool.

18. The method of claim 17 wherein the statistical measures include mean, average deviation, variance, standard deviation, and/or multiples of the standard deviation.

19. The method of claim 11 wherein determining the first profile of the structure using the optimized profile model and the first metrology tool after the first fabrication step further comprises:

creating a library of diffraction signals and corresponding profile model parameters using the optimized profile model; and selecting a best match of a measured diffraction signal using the library of diffraction signals and corresponding profile model parameters.

20. The method of claim 11 wherein determining the first profile of the structure using the optimized profile model and the first metrology tool after the first fabrication step further comprises:

creating a set of diffraction signals and corresponding profile model parameters using the optimized profile model;

training a machine learning system with the set of diffraction signals and corresponding profile model parameters, the machine learning system configured after being trained to determine a profile model parameter based on an input diffraction signal.

21. The method of claim 11 wherein determining the first profile of the structure using the optimized profile model and the first metrology tool after the first fabrication step further comprises:
generating a hypothetical profile based on the optimized profile model, the hypothetical profile corresponding to a measured diffraction signal off the structure;
calculating a simulated diffraction signal of the structure using a rigorous numerical approach and the generated hypothetical profile;
comparing the simulated diffraction signal to the measured diffraction signal; and
iterating the generating, calculating, and comparing steps to improve agreement of the simulated diffraction signal to the measured diffraction signal.

22. The method of claim 10 wherein the set acceptable ranges of the selected one or more profile model parameters includes a range of values of one or more critical dimensions of the structure.

23. The method of claim 10 wherein the set acceptable ranges of the selected one or more profile model parameters includes a range of values of a bottom width of the structure and a range of values of a side wall angle of the structure.

24. A method of evaluating the adequacy of a profile model of a wafer structure to be used for process control of a fabrication process to fabricate the wafer structure, the profile model including profile model parameters, the method comprising:
a) selecting one or more types of process control to be used in controlling the fabrication process;
b) selecting one or more profile model parameters to be measured in implementing the one or more selected types of process control;
c) setting an acceptable range for each of the selected one or more profile model parameters;
d) setting one or more statistical metric criteria that define an acceptable amount of variation in measurements obtained using a scatterometer and a critical dimension scanning electron microscope (CDSEM);
e) selecting a profile model to be used with the scatterometer;
f) obtaining a measurement of the one or more profile model parameters using the scatterometer and the selected profile model;
g) obtaining a measurement of the one or more profile model parameters using the CDSEM;
h) calculating the one or more statistical metric criteria based on the measurements of the one or more profile model parameters obtained using the scatterometer and the CDSEM;
i) comparing the one or more calculated statistical metric criteria to the one or more set statistical metric criteria to evaluate the adequacy of the selected profile model.

25. A system for evaluating the adequacy of a profile model of a wafer structure to be used for process control of a fabrication process to fabricate the wafer structure, the profile model including profile model parameters, the system comprising:
a wafer having a structure formed thereon, the structure characterized by a profile model, the profile model having profile model parameters;
a first semiconductor fabrication device configured to perform a first fabrication process on the wafer;
a second semiconductor fabrication device configured to perform one or more subsequent fabrication processes on the wafer;
a first metrology tool configured to measure the structure;
a second metrology tool configured to calibrate the first metrology tool; and
a processor configured to:
a) select one or more types of process control to be used in controlling the fabrication process;
b) select one or more profile model parameters to be measured in implementing the one or more selected types of process control;
c) set an acceptable range for each of the selected one or more profile model parameters;
d) select a first metrology tool to be used in measuring the one or more selected profile model parameters of the structure during the fabrication process;
e) select a second metrology tool to be used to calibrate the first metrology tool;
f) set one or more statistical metric criteria that define an acceptable amount of variation in measurements obtained using the first metrology tool and the second metrology tool;
g) select a profile model to be used with the first metrology tool;
h) obtain a measurement of the one or more profile model parameters using the first metrology tool and the selected profile model;
i) obtain a measurement of the one or more profile model parameters using the second metrology tool;
j) calculate the one or more statistical metric criteria based on the measurements of the one or more profile model parameters obtained using the first and second metrology tools;
k) compare the one or more calculated statistical metric criteria to the one or more set statistical metric criteria to evaluate the adequacy of the selected profile model.

26. The system of claim 25 wherein the first metrology tool includes a cross section scanning electron microscope (XSEM), a critical dimension atomic force microscope (CD-AFM), a transmission electron microscope (TEM), a critical dimension scanning electron microscope (CDSEM), or a scatterometer.

27. The system of claim 26 wherein the second metrology tool includes an XSEM, a CD-AFM, a TEM, a CDSEM or a scatterometer.

28. The system of claim 27 wherein the scatterometer is selected as the first metrology tool and the CDSEM is selected as the second metrology tool.

29. The system of claim 28 wherein the scatterometer includes a reflectometer or an ellipsometer.

30. The system of claim 25 wherein the first metrology tool is integrated with the first semiconductor fabrication device.

31. The system of claim 25 wherein the first metrology tool is integrated with the second semiconductor fabrication device.

32. The system of claim 25 wherein the first semiconductor fabrication device and the second semiconductor fabrication device comprise a single unit.

33. The system of claim 25 wherein the first semiconductor fabrication device, the second semiconductor fabrication device, the first metrology tool and the processor are integrated into a single unit.

34. A computer-readable storage medium containing computer executable instructions for causing a computer to optimize a metrology profile model of a wafer structure for fabrication process control, comprising instructions for:
- a) selecting one or more types of process control to be used in controlling the fabrication process;
- b) selecting one or more profile model parameters to be measured in implementing the one or more selected types of process control;
- c) setting an acceptable range for each of the selected one or more profile model parameters;
- d) selecting a first metrology tool to be used in measuring the one or more selected profile model parameters of the wafer structure during the fabrication process;
- e) selecting a second metrology tool to be used to calibrate the first metrology tool;
- f) setting one or more statistical metric criteria that define an acceptable amount of variation in measurements obtained using the first metrology tool and the second metrology tool;
- g) selecting a profile model to be used with the first metrology tool;
- h) obtaining a measurement of the one or more profile model parameters using the first metrology tool and the selected profile model;
- i) obtaining a measurement of the one or more profile model parameters using the second metrology tool;
- j) calculating the one or more statistical metric criteria based on the measurements of the one or more profile model parameters obtained using the first and second metrology tools; and
- k) comparing the one or more calculated statistical metric criteria to the one or more set statistical metric criteria to evaluate the adequacy of the selected profile model.

35. The computer-readable storage medium of claim 34 wherein a scatterometer is selected as the first metrology tool and a critical dimension scanning electron microscope (CDSEM) is selected as the second metrology tool.

* * * * *